(12) United States Patent
Chen et al.

(10) Patent No.: US 11,146,296 B2
(45) Date of Patent: Oct. 12, 2021

(54) CODEWORD BIT SELECTION FOR RATE-COMPATIBLE POLAR CODING

(71) Applicants: QUALCOMM Incorporated, San Diego, CA (US); Kai Chen, Guangdong (CN); Changlong Xu, San Diego, CA (US); Liangming Wu, San Diego, CA (US); Jing Jiang, San Diego, CA (US); Hao Xu, San Diego, CA (US)

(72) Inventors: Kai Chen, Shenzhen (CN); Changlong Xu, Beijing (CN); Liangming Wu, Beijing (CN); Jing Jiang, San Diego, CA (US); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/733,711

(22) PCT Filed: Apr. 2, 2019

(86) PCT No.: PCT/CN2019/081023
§ 371 (c)(1),
(2) Date: Oct. 1, 2020

(87) PCT Pub. No.: WO2019/192480
PCT Pub. Date: Oct. 10, 2019

(65) Prior Publication Data
US 2021/0036718 A1    Feb. 4, 2021

(30) Foreign Application Priority Data
Apr. 4, 2018    (WO) ............... PCT/CN2018/081842

(51) Int. Cl.
*H03M 13/45*    (2006.01)
*H03M 13/00*    (2006.01)
(Continued)

(52) U.S. Cl.
CPC ........... *H03M 13/45* (2013.01); *H03M 13/13* (2013.01); *H03M 13/43* (2013.01);
(Continued)

(58) Field of Classification Search
CPC .......................... H03M 13/45; H03M 13/635
See application file for complete search history.

(56) References Cited

U.S. PATENT DOCUMENTS

| 2003/0217319 A1* | 11/2003 | Tripathi et al. ... | H03M 13/3905 |
| | | | 714/751 |
| 2011/0252288 A1* | 10/2011 | Sharon et al. ...... | G06F 11/1048 |
| | | | 714/758 |
| 2015/0333769 A1 | 11/2015 | Jeong et al. | |

FOREIGN PATENT DOCUMENTS

| CN | 103314560 A | 9/2013 |
| CN | 107026709 A | 8/2017 |

(Continued)

OTHER PUBLICATIONS

International Search Report and Written Opinion—PCT/CN2018/081842—ISA/EPO—dated Jan. 4, 2019.

(Continued)

*Primary Examiner* — Joseph D Torres
(74) *Attorney, Agent, or Firm* — Harrity & Harrity, LLP/Qualcomm (57) ABSTRACT

Various aspects of the present disclosure generally relate to wireless communication. In some aspects, an encoding device may determine a least reliable subset of information bits included in a set of information bits that includes a predefined active set of information bits to be encoded; may determine a codeword bit to be added to a codeword based at least in part on the least reliable subset of information bits, wherein adding the codeword bit to the codeword improves reliability of the least reliable subset of information bits; may add the codeword bit to the codeword; and may transmit the codeword. Numerous other aspects are provided.

30 Claims, 6 Drawing Sheets

(51) Int. Cl.
  *H03M 13/13* (2006.01)
  *H03M 13/43* (2006.01)
  *H04L 1/18* (2006.01)

(52) U.S. Cl.
  CPC ....... *H03M 13/635* (2013.01); *H03M 13/658* (2013.01); *H04L 1/1819* (2013.01)

(56) References Cited

FOREIGN PATENT DOCUMENTS

| WO | 2015139316 A1 | 9/2015 |
| WO | 2017018859 A1 | 2/2017 |
| WO | 2017106246 A2 | 6/2017 |
| WO | 2017128700 A1 | 8/2017 |
| WO | 2017209836 A1 | 12/2017 |
| WO | 2017215382 A1 | 12/2017 |

OTHER PUBLICATIONS

International Search Report and Written Opinion—PCT/CN2019/081023—ISA/EPO—dated Jun. 21, 2019.

Mediatek Inc: "Polar Code Design Features for Control Channels", R1-1701212, 3GPP TSG RAN WG1 AH_NR Meeting, Jan. 20, 2017 (Jan. 20, 2017), 9 Pages.

ZTE: ZTE Micro Electronics, "Discussion on Polar Codes for NR", 3GPP TSG RAN WG #86 R1-166415, Aug. 26, 2016, 9 Pages.

\* cited by examiner

CODEWORD BIT SELECTION FOR RATE-COMPATIBLE POLAR CODING

CROSS-REFERENCE TO RELATED APPLICATIONS

This application is a 371 national stage of PCT Application No. PCT/CN2019/081023 filed on Apr. 2, 2019, entitled "CODEWORD BIT SELECTION FOR RATE-COMPATIBLE POLAR CODING," which claims priority to Patent Cooperation Treaty (PCT) Patent Application No. PCT/CN2018/081842, filed on Apr. 4, 2018, entitled "TECHNIQUES AND APPARATUSES FOR CODEWORD BIT SELECTION FOR RATECOMPATIBLE POLAR CODING," which are hereby expressly incorporated by reference herein.

FIELD OF THE DISCLOSURE

Aspects of the present disclosure generally relate to wireless communication, and more particularly to techniques and apparatuses for codeword bit selection for rate-compatible polar coding.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a new radio (NR) BS, a 5G Node B, and/or the like.

The above multiple access technologies have been adopted in various telecommunication standards to provide a common protocol that enables different user equipment to communicate on a municipal, national, regional, and even global level. New radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication, performed by an encoding device, may include determining a least reliable subset of information bits included in a set of information bits that includes a predefined active set of information bits to be encoded; determining a codeword bit to be added to a codeword based at least in part on the least reliable subset of information bits, wherein adding the codeword bit to the codeword improves reliability of the least reliable subset of information bits; adding the codeword bit to the codeword; and transmitting the codeword.

In some aspects, an encoding device for wireless communication may include memory and one or more processors operatively coupled to the memory. The memory and the one or more processors may be configured to determine a least reliable subset of information bits included in a set of information bits that includes a predefined active set of information bits to be encoded; determine a codeword bit to be added to a codeword based at least in part on the least reliable subset of information bits, wherein adding the codeword bit to the codeword improves reliability of the least reliable subset of information bits; add the codeword bit to the codeword; and transmit the codeword.

In some aspects, a non-transitory computer-readable medium may store one or more instructions for wireless communication. The one or more instructions, when executed by one or more processors of an encoding device, may cause the one or more processors to determine a least reliable subset of information bits included in a set of information bits that includes a predefined active set of information bits to be encoded; determine a codeword bit to be added to a codeword based at least in part on the least reliable subset of information bits, wherein adding the codeword bit to the codeword improves reliability of the least reliable subset of information bits; add the codeword bit to the codeword; and transmit the codeword.

In some aspects, an apparatus for wireless communication may include means for determining a least reliable subset of information bits included in a set of information bits that includes a predefined active set of information bits to be encoded; means for determining a codeword bit to be added to a codeword based at least in part on the least reliable subset of information bits, wherein adding the codeword bit to the codeword improves reliability of the least reliable subset of information bits; means for adding the codeword bit to the codeword; and means for transmitting the codeword.

Aspects generally include a method, apparatus, system, computer program product, non-transitory computer-readable medium, user equipment, base station, wireless communication device, processing system, and encoding device as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It is noted that while aspects may be described herein using terminology commonly associated with 3G and/or 4G wireless technologies, aspects of the present disclosure can be applied in other generation-based communication systems, such as 5G and later, including NR technologies.

Figure 1:
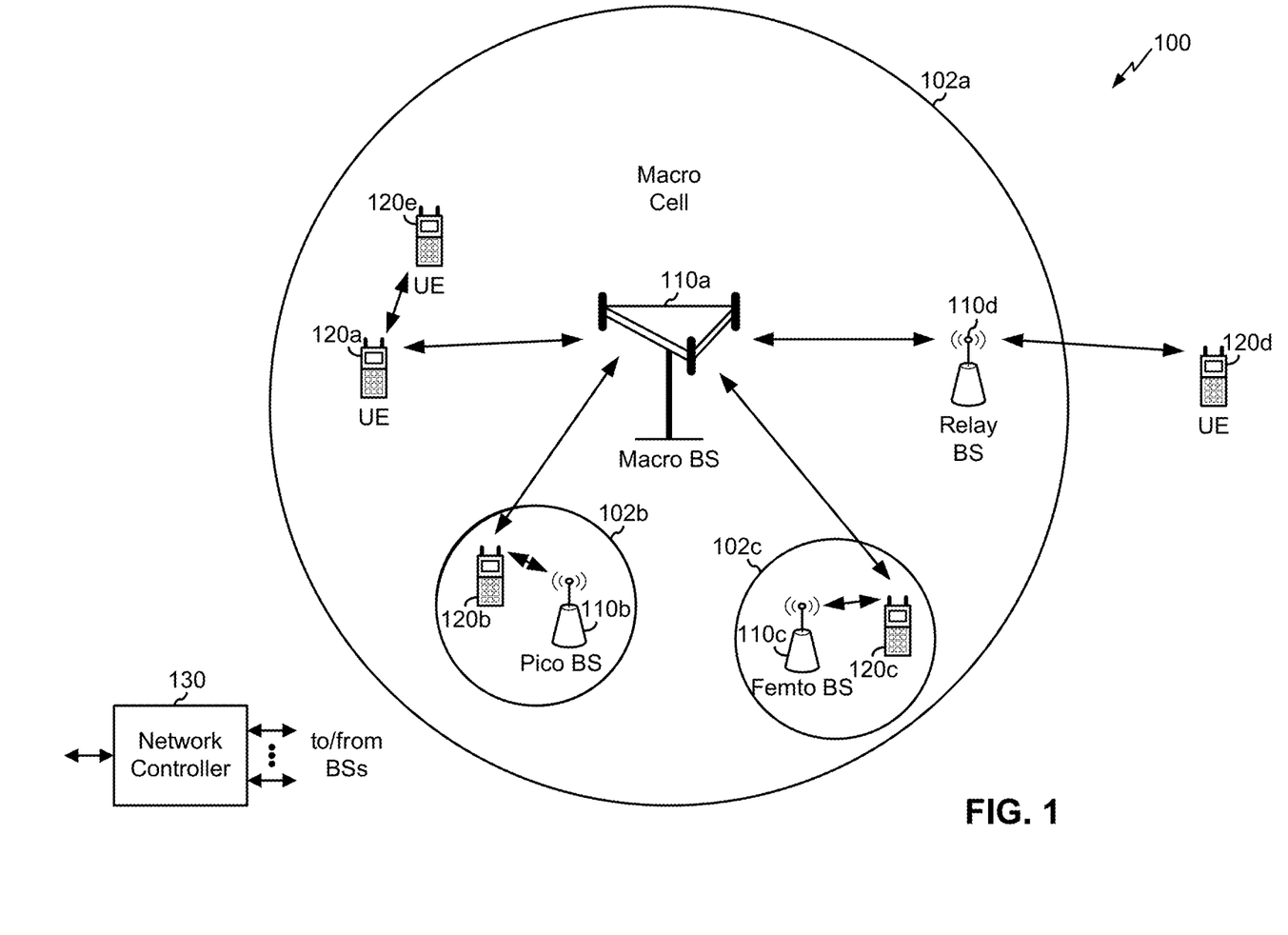
FIG. 1 is a block diagram conceptually illustrating an example of a wireless communication network, in accordance with various aspects of the present disclosure.

FIG. 1 is a diagram illustrating a network 100 in which aspects of the present disclosure may be practiced. The network 100 may be an LTE network or some other wireless network, such as a 5G or NR network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the access network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impact on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul. UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, such as sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided merely as an example. Other examples are possible and may differ from what was described with regard to FIG. 1.

Figure 2:
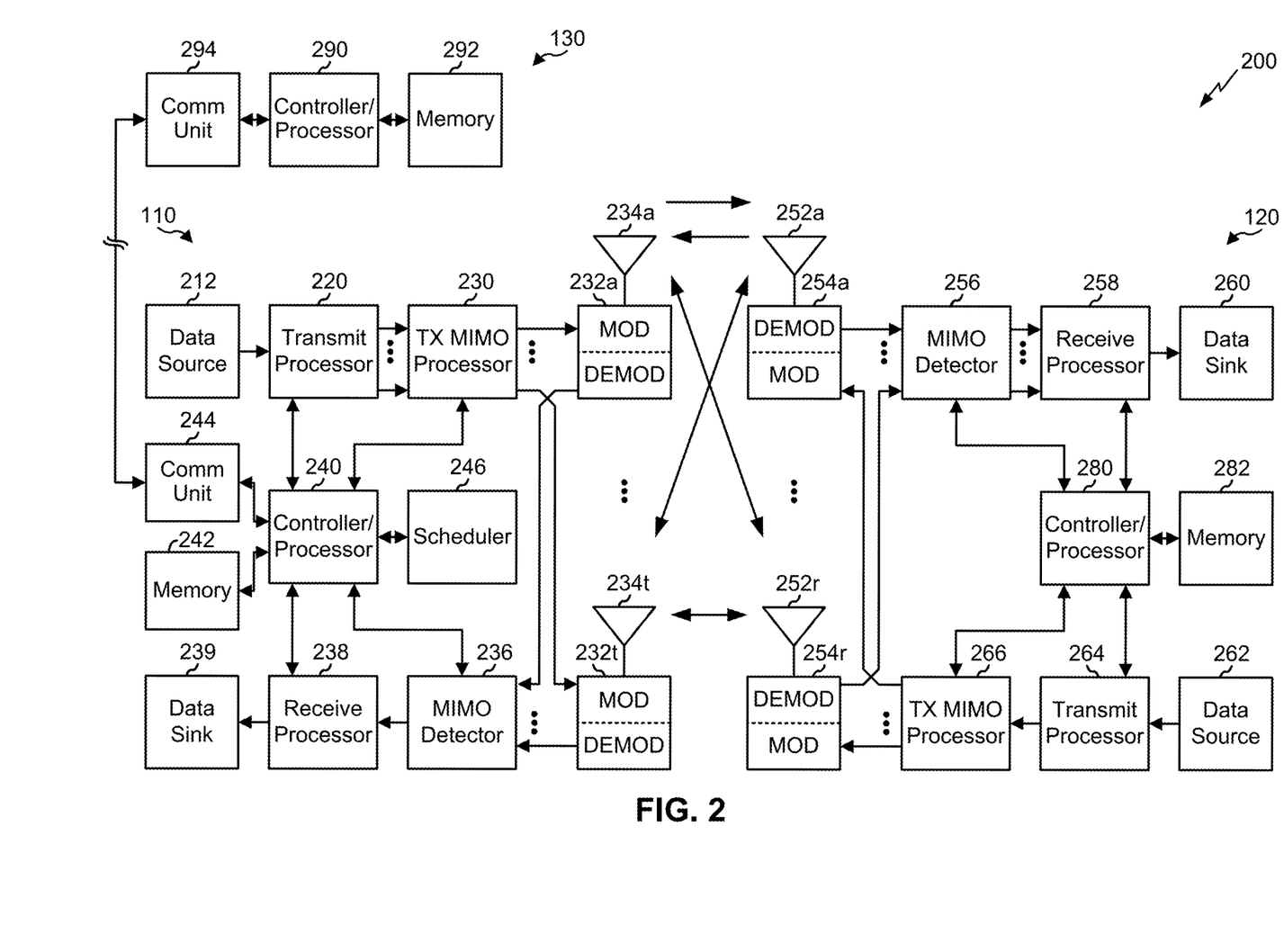
FIG. 2 is a block diagram conceptually illustrating an example of a base station in communication with a user equipment (UE) in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

In some aspects, one or more components of UE 120 may be included in a housing. Controller/processor 240 of base station 110, controller/processor 280 of UE 120, and/or any other component(s) of FIG. 2 may perform one or more techniques associated with codeword bit selection for rate-compatible polar coding, as described in more detail elsewhere herein. For example, controller/processor 240 of base station 110, controller/processor 280 of UE 120, and/or any other component(s) of FIG. 2 may perform or direct operations of, for example, process 600 of FIG. 6 and/or other processes as described herein. Memories 242 and 282 may store data and program codes for base station 110 and UE 120, respectively. A scheduler 246 may schedule UEs for data transmission on the downlink and/or uplink.

In some aspects, an encoding device (e.g., UE 120, base station 110, and/or the like) may include means for determining a least reliable subset of information bits included in a set of information bits that includes a predefined active set of information bits to be encoded; means for determining a codeword bit to be added to a codeword based at least in part on the least reliable subset of information bits, wherein adding the codeword bit to the codeword improves reliability of the least reliable subset of information bits; means for adding the codeword bit to the codeword; means for transmitting the codeword; and/or the like. In some aspects, such means may include one or more components of UE 120 described in connection with FIG. 2. In some aspects, such means may include one or more components of base station 110 described in connection with FIG. 2.

As indicated above, FIG. 2 is provided merely as an example. Other examples are possible and may differ from what was described with regard to FIG. 2.

Figure 3:
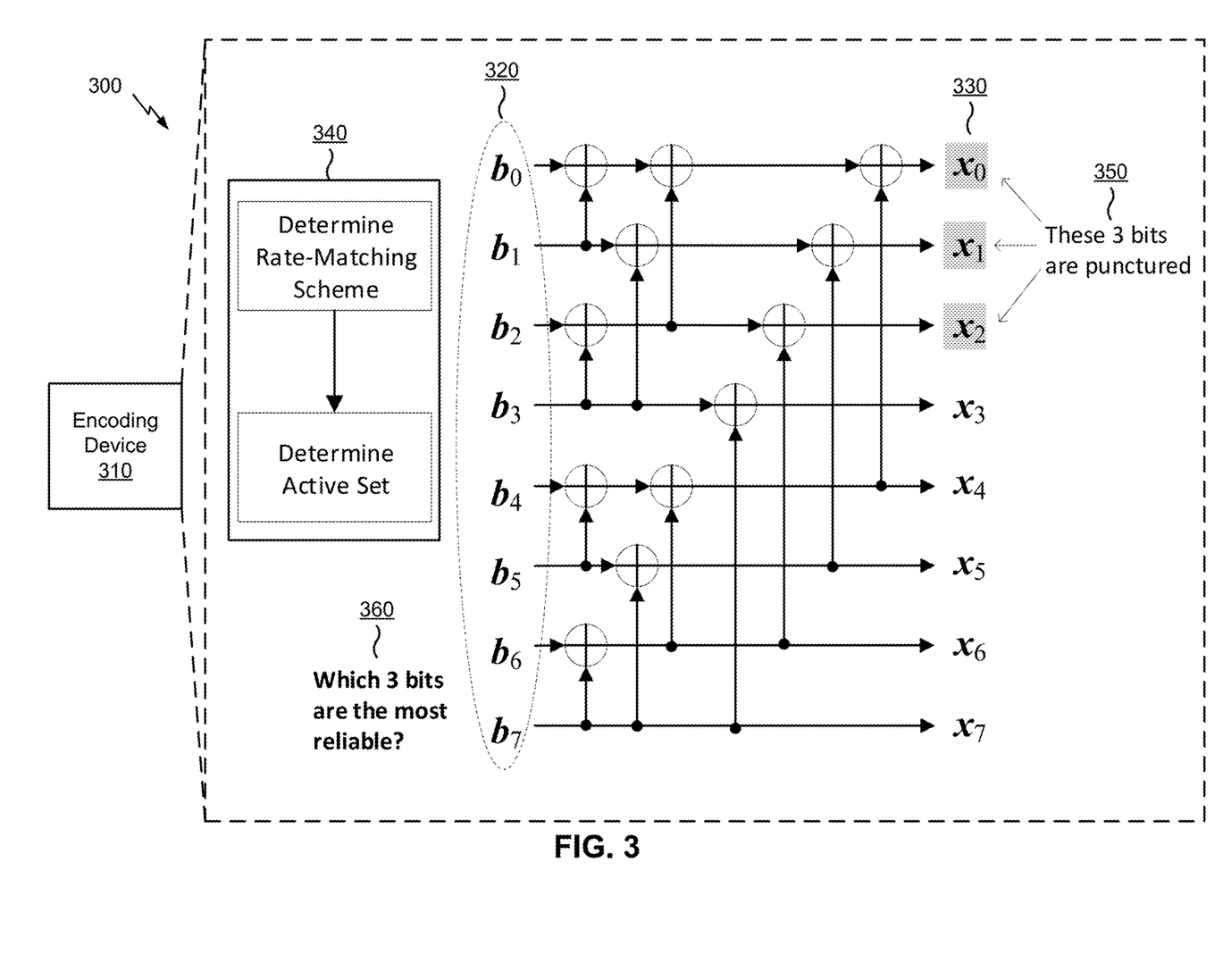
FIG. 3 is a diagram illustrating an example of determining an active set of information bits based at least in part on a rate-matching scheme, in accordance with various aspects of the present disclosure.

FIG. 3 is a diagram illustrating an example 300 of determining an active set of information bits based at least in part on a rate-matching scheme, in accordance with various aspects of the present disclosure.

As shown in FIG. 3, an encoding device 310 (e.g., a base station 110, a UE 120, and/or the like) may encode a set of information bits, shown by reference number 320, into a codeword that includes a set of codeword bits, shown by reference number 330. The encoding device 310 may use polar coding to perform such encoding, and may transmit the codeword via a wireless communication channel (e.g., an air interface). The set of information bits is shown as a set of eight bits $b_0$ through $b_7$, but may include a different number of bits, in some aspects. Similarly, the set of codeword bits is shown as a set of eight bits $x_0$ through $x_7$, but may include a different number of bits, in some aspects. For polar coding, the set of information bits and/or the set of corresponding codeword bits may be a power of 2. For example, the set of information bits and/or codeword bits may include N bits, where $N=2^n$.

As shown by reference number 340, the encoding device 310 may generate the codeword by first determining a rate-matching scheme (e.g., to match a number of bits in a transport block to a number of bits that can be transmitted in a given resource allocation), and then determining an active set of information bits to be encoded in the codeword based at least in part on the given rate-matching scheme. For example, as shown by reference number 350, the rate matching scheme may indicate that three of the possible eight codeword bits are to be punctured (e.g., $x_0$, $x_1$, and $x_2$), and that five of the eight possible codeword bits are to be transmitted (e.g., $x_3$, $x_4$, $x_5$, $x_6$, $x_7$, and $x_8$) in the codeword.

As shown by reference number 360, given this rate-matching scheme, the encoding device 310 may determine the three most reliable information bits to be encoded into the five codeword bits that are to be transmitted (e.g., using repetition and/or the like to match the information bits into the desired codeword length). In this way, the most reliable information bits may be selected as a set of active bits used to carry information via a transmitted codeword.

However, when the encoding device 310 first determines the rate-matching scheme to be used, and then determines the set of active bits, this may require the set of active bits to be adjusted for different rate-matching schemes, for different channel conditions, for different reliabilities, and/or the like. In some cases, a set of active bits that is not fixed (e.g., that changes) may be undesirable. For example, in a hybrid automatic repeat request incremental redundancy (HARQ-IR) process, parity bits may be transmitted in an incremental fashion depending on channel quality, and a number of parity bits to be transmitted may be selected according to a rate requirement. This HARQ-IR process requires codewords to be rate-compatible, where a set of parity bits of a higher rate code is a subset of the set of parity bits of a lower rate code, so that a decoding device that fails to decode a codeword at a particular (e.g., higher) rate can request only the additional parity bits of the lower rate code, thereby reducing latency, conserving resources, and improving performance. When the set of active bits are not fixed, such a HARQ-IR process may be difficult or impossible to perform.

Techniques and apparatuses described herein permit a fixed active set of information bits to be used for polar coding, and permit a reliable set of codeword bits to be selected by an encoding device 310 based at least in part on the fixed active set of information bits. In this way, reliability may be improved while permitting a HARQ-IR process to be performed.

As indicated above, FIG. 3 is provided as an example. Other examples are possible and may differ from what was described with respect to FIG. 3.

Figure 4:
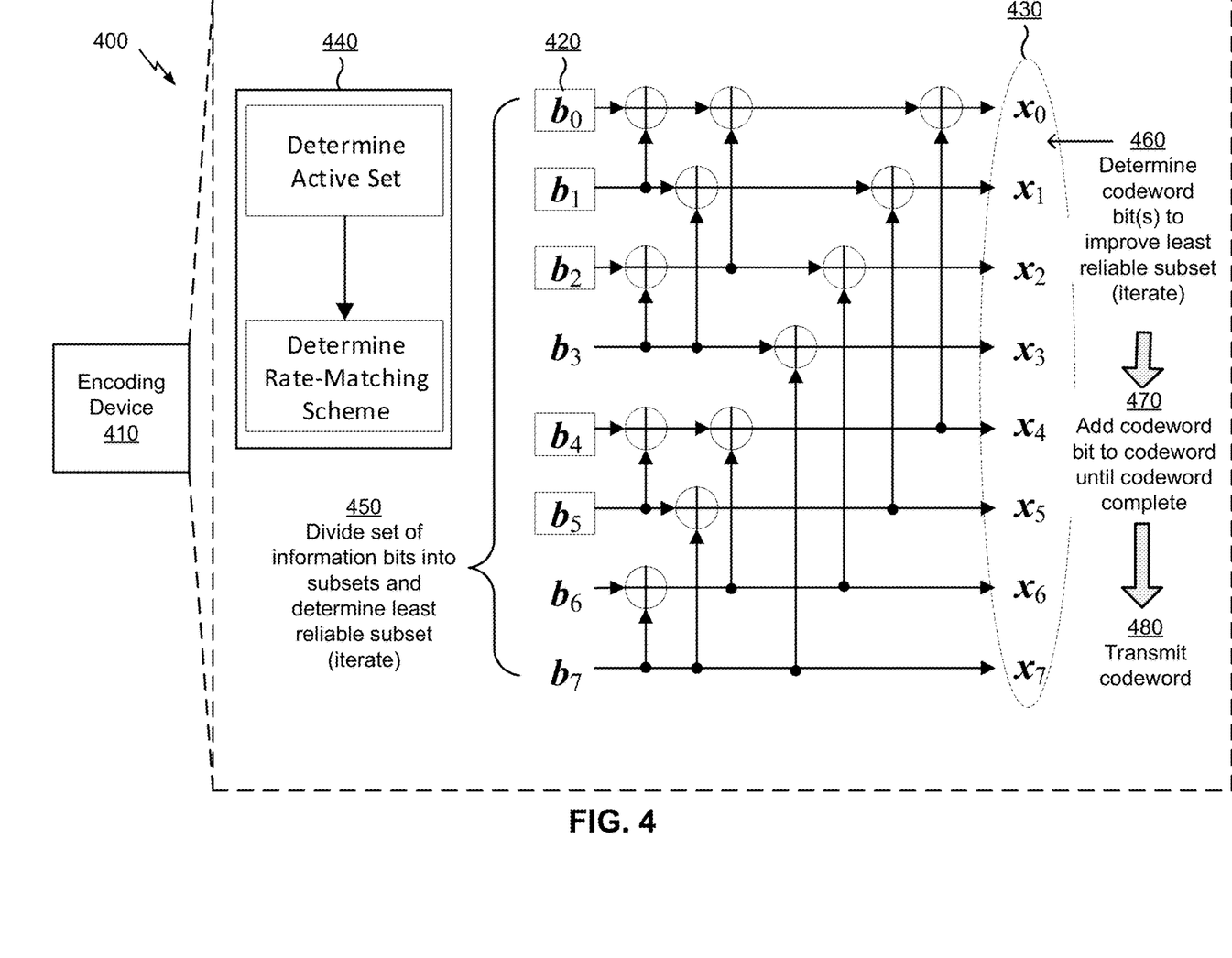
FIGS. 4 and 5 are diagrams illustrating examples of codeword bit selection for rate-compatible polar coding, in accordance with various aspects of the present disclosure.

FIG. 4 is a diagram illustrating an example 400 of codeword bit selection for rate-compatible polar coding, in accordance with various aspects of the present disclosure.

As shown in FIG. 4, an encoding device 410 (e.g., a base station 110, a UE 120, and/or the like) may encode a set of information bits, shown by reference number 420, into a codeword that includes a set of codeword bits, shown by reference number 430. The encoding device 410 may use polar coding to perform such encoding, and may transmit the codeword via a wireless communication channel (e.g., an air interface). The set of information bits is shown as a set of eight bits $b_0$ through $b_7$, but may include a different number of bits, in some aspects. Similarly, the set of codeword bits is shown as a set of eight bits $x_0$ through $x_7$, but may include a different number of bits, in some aspects. For polar coding, the set of information bits and/or the set of corresponding codeword bits may be a power of 2. For example, the set of information bits and/or codeword bits may include N bits, where $N=2^n$.

As shown by reference number 440, the encoding device 410 may generate the codeword by first determining an active set of information bits (e.g., a predefined active set of information bits to be encoded), and then determining a rate-matching scheme for encoding the active set of information bits (e.g., to match a number of bits in a transport block to a number of bits that can be transmitted in a given resource allocation) based at least in part on the active set of information bits. In this way, the codeword bits to be included in the codeword and transmitted to a decoding device (e.g., a UE 120, a base station 110, and/or the like) may be selected to improve and/or optimize reliability for a given set of active information bits (e.g., to be used for a HARQ-IR process), thereby increasing the likelihood that the decoding device successfully decodes the transmitted information.

For example, as shown by reference number 450, the encoding device 410 may divide the set of information bits (e.g., the overall set of information bits, shown as $b_0$ through $b_7$) into subsets of information bits (e.g., two mutually exclusive subsets that together include all of the information bits in the overall set of information bits), and may determine a least reliable subset. The set of information bits may include a predefined active set of information bits to be encoded. For example, the predefined active set of information bits may be a subset of the set of information bits shown by reference number 420. In some aspects, the encoding device 410 may determine the predefined active set of information bits based at least in part on information stored in memory of the encoding device 410, may determine the predefined active set of information bits according to a 3GPP standard (e.g., 3GPP 38.212 and/or the like), may determine the predefined active set of information bits using a quasi-uniform puncturing (QUP) technique (e.g., a QUP density evolution technique), may determine the predefined active set of information bits using random puncturing, and/or the like. In FIG. 4, the example predefined active set of information bits is shown as including three bits (e.g., $b_3$, $b_6$, and $b_7$), but may include a different number of bits, in some aspects.

In some aspects, the encoding device 410 may calculate a reliability (i.e., a measure of reliability) for a subset of information bits by calculating a reliability of each information bit included in the subset. The reliability for the subset may be determined based at least in part on the reliabilities of the information bits included in the subset, such as a minimum reliability of the information bits, an average reliability of the information bits, and/or the like.

The encoding device 410 may determine a subset of information bits that has the lowest reliability (e.g., between two or more subsets of information bits). In some aspects, the reliability may indicate an estimated block error rate (BLER) associated with an information bit and/or a subset of information bits.

As shown by reference number 460, the encoding device 410 may determine a set of (e.g., one or more) codeword bits that, if added to the codeword, would improve reliability of the least reliable subset of information bits. For example, the encoding device 410 may select a set of codeword bits that improves reliability of the least reliable subset of information bits. In some aspects, the encoding device 410 may calculate or estimate an improvement to the least reliable subset of information bits for multiple sets of codeword bits, and may select a set of codeword bits that results in the biggest improvement to the reliability of the least reliable subset of information bits. In some aspects, the encoding device 410 may determine the codeword bit to be added to the codeword by iteratively dividing the set of information bits into two subsets of information bits (e.g., a first subset of information bits and a second subset of information bits), determining a least reliable subset (of the two) to be improved, diving the least reliable subset into two subsets, and so on, until the subsets reach a predefined size. The encoding device 410 may then determine a least reliable subset of the predefined size, and may identify a codeword bit to be added to the codeword to improve reliability of the least reliable subset of the predefined size. In some aspects, the predefined size (e.g., $N_b$) may be stored in memory of the encoding device 410 and/or may be indicated to the encoding device 410 by a decoding device and/or another device. In some aspects, the predefined size may be a power of two (e.g., $2^0$, $2^1$, $2^2$, $2^4$, and/or the like). Additional details are described in below in connection with FIG. 5.

As shown by reference number 470, the encoding device 410 may add the identified codeword bit to the codeword, and may iteratively perform the operations described in connection with reference numbers 450-470 until the codeword reaches a predefined length (e.g., the codeword is complete). For example, the encoding device 410 may add codeword bits to the codeword until a length of the codeword satisfies a threshold (e.g., is equal to a predefined length, which may be stored in memory of the encoding device 410 and/or indicated to the encoding device 410 by a decoding device or another device).

In some aspects, the codeword may initially be empty (e.g., may not include any codeword bits), and the encoding device 410 may add the codeword bit to the empty codeword. If the threshold (e.g., the predefined length of the codeword) is equal to one, then the encoding device 410 may transmit the codeword after adding the codeword bit to the empty codeword, and the transmitted codeword may include only the single added codeword bit and no other codeword bits.

However, if the threshold is greater than one, then the encoding device 410 may determine another codeword bit to be added to the codeword. In this case, the encoding device 410 may again determine a least reliable subset of information bits included in the overall set of information bits (e.g., as described above in connection with reference number 450), may determine a codeword bit to be added to the codeword to improve reliability of the least reliable subset of information bits (e.g., as described above in connection with reference number 460), and may add the codeword bit to the codeword. In this case, the encoding device 410 may recalculate a reliability for each information bit and/or subset, and may identify a subset of information bits that has a lowest reliability as compared to other subsets of information bits. In some aspects, the identified codeword bit to be added may be the same as a previously identified codeword bit. In some aspects, the identified codeword bit may be a different codeword bit than previously identified.

When calculating reliabilities for the information bits and/or subsets of information bits, the calculated reliabilities may factor in the codeword bit(s) already added to or included in the codeword. For example, the encoding device 410 may determine the least reliable subset of information bits based at least in part on one or more codeword bits (e.g., all codeword bits) included in the codeword. In this way, the encoding device 410 may determine a new least reliable subset of information bits after improving a previously identified least reliable subset of information bits (e.g., via selection of a codeword bit that improves reliability of the previously identified least reliable subset of information bits), thereby improving reliability of the codeword to be transmitted.

Likewise, when determining a new codeword bit that improves the reliability of the new least reliable subset of information bits, the encoding device 410 may factor in the codeword bit(s) already added to or included in the codeword. For example, the encoding device 410 may determine the new codeword bit based at least in part on one or more codeword bits (e.g., all codeword bits) included in the codeword. In some aspects, the encoding device 410 may determine each codeword bit, to be added to the codeword, based at least in part on a corresponding least reliable subset of information bits determined after adding a previously determined codeword bit to the codeword. In this way, the encoding device 410 may iteratively improve reliability of the codeword to be transmitted with each codeword bit added to the codeword.

As shown by reference number 480, the encoding device 410 may transmit the codeword. For example, the encoding device 410 may transmit the codeword based at least in part on determining that the length of the codeword (e.g., a number of codeword bits included in the codeword) satisfies a threshold. In some aspects, if the threshold is equal to one, then the transmitted codeword may include a single codeword bit and no other codeword bits. Alternatively, if the threshold is greater than one, then the transmitted codeword may include multiple codeword bits.

In some aspects, the initial codeword, to which an initial codeword bit is added using the techniques described herein, may be empty. Alternatively, the initial codeword, to which an initial codeword bit is added using the techniques described herein, may include one or more predefined codeword bits. In either case, the encoding device 410 may add one or more codeword bits to the initial codeword until a length of the codeword satisfies a threshold, and may then transmit the codeword to a decoding device. In this way, a reliability of the codeword may be improved and/or optimized for a given set of active information bits (e.g., to be used for a HARQ-IR process), thereby increasing the likelihood that the decoding device successfully decodes the transmitted information.

As indicated above, FIG. 4 is provided as an example. Other examples are possible and may differ from what was described with respect to FIG. 4.

Figure 5:
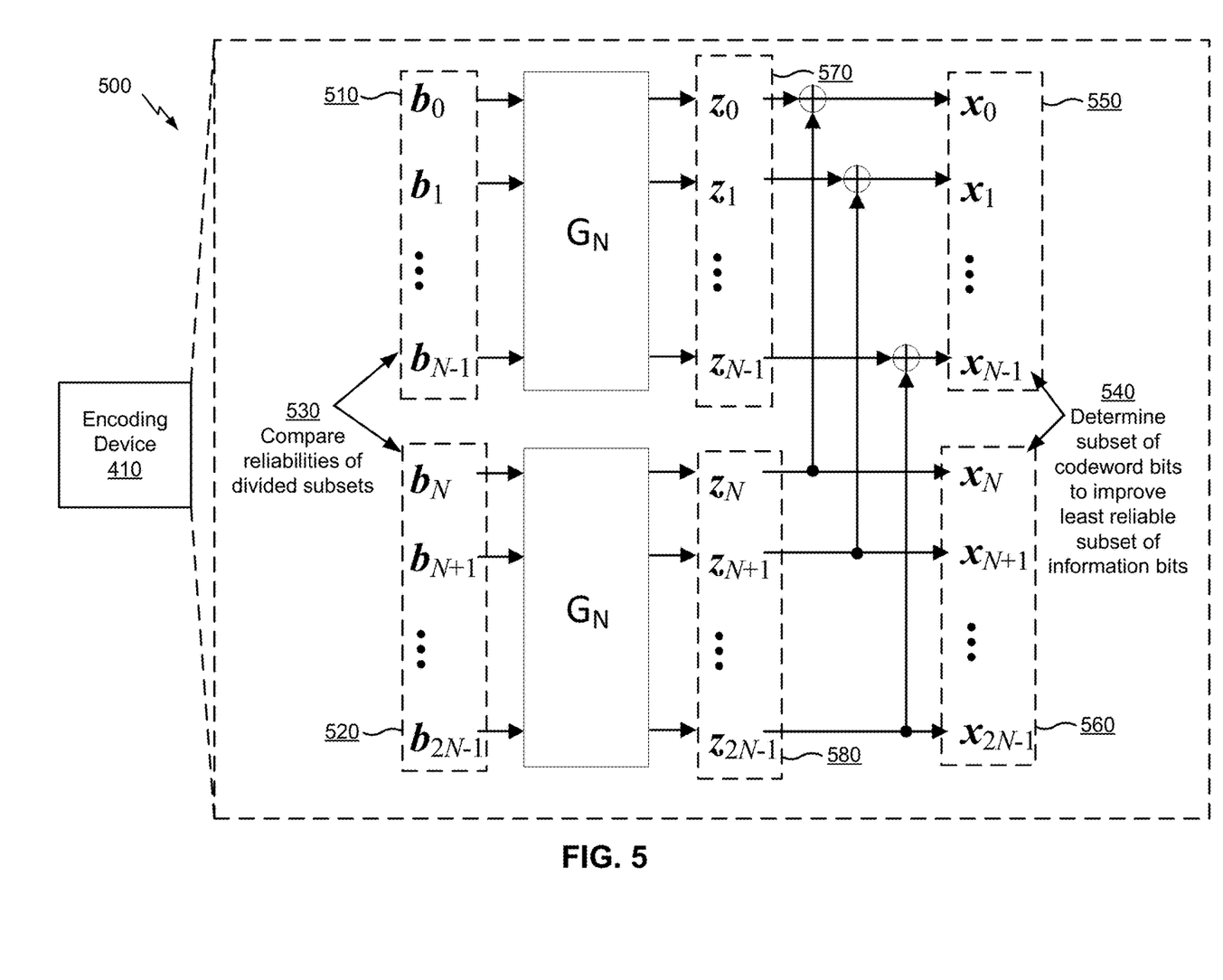

FIG. 5 is a diagram illustrating an example 500 of codeword bit selection for rate-compatible polar coding, in accordance with various aspects of the present disclosure.

As shown in FIG. 5, the encoding device 410 may divide a set of information bits (e.g., the set of information bits shown by reference number 420 of FIG. 4) into a first subset of information bits 510 (e.g., shown as $b_0$ through $b_{N-1}$) and a second subset of information bits 520 (e.g., shown as $b_N$ through $b_{2N-1}$). As shown, the first subset of information bits 510 and the second subset of information bits 520 are mutually exclusive (e.g., do not include any of the same information bits), and together include all of the information bits in the set of information bits that has been divided to form the first subset and the second subset.

As shown by reference number 530, the encoding device 410 may compare a first reliability associated with the first subset of information bits 510 and a second reliability associated with the second subset of information bits 520. For example, the encoding device 410 may compare a reliability of the least reliable information bit included in the first subset of information bits 510 and a reliability of the least reliable information bit included in the second subset of information bits 520. Additionally, or alternatively, the encoding device 410 may compare a reliability calculated using the entire first subset of information bits 510 (e.g., an average reliability of the information bits included in the first subset, a minimum reliability of the information bit included in the first subset, a maximum reliability of the information bits included in the first subset, and/or the like) and a reliability calculated using the entire second subset of information bits 520.

As shown by reference number 540, the encoding device 410 may determine a subset of codeword bits that improves reliability of the least reliable subset of information bits based at least in part on comparing the first reliability associated with the first subset of information bits 510 and the second reliability associated with the second subset of information bits 520. For example, the encoding device 410 may identify a first subset of codeword bits 550, corresponding to the first subset of information bits 510, or a second subset of codeword bits 560, corresponding to the second subset of information bits 520, based at least in part on comparing the first reliability and the second reliability.

In some aspects, the encoding device 410 may identify the subset of codeword bits to improve a less reliable subset of either the first subset of codeword bits 550 or the second subset of codeword bits 560 based at least in part on a determination that the first subset of information bits 510 is not more reliable than the second subset of information bits 520. In this case, since a reliability associated with the first subset of information bits 510 is less than or equal to a reliability associated with the second subset of information bits 520, the encoding device 410 may select a subset of codeword bits that improves the reliability of the first subset of information bits 510. To improve the reliability of the first subset of information bits 510, the encoding device 410 may select a subset of codeword bits that improves reliability of a first subset of intermediate bits 570 corresponding to the first subset of information bits 510. In this case, the encoding device 410 may select a less reliable subset of either the first subset of codeword bits 550 or the second subset of codeword bits 560.

In some aspects, the encoding device 410 may identify the subset of codeword bits to improve a more reliable subset of either the first subset of codeword bits 550 or the second subset of codeword bits 560 based at least in part on a determination that the first subset of information bits 510 is more reliable than the second subset of information bits 520. In this case, since a reliability associated with the first subset of information bits 510 is greater than a reliability associated with the second subset of information bits 520, the encoding device 410 may select a subset of codeword bits that improves the reliability of the second subset of information bits 520. To improve the reliability of the second subset of information bits 520, the encoding device 410 may select a subset of codeword bits that improves reliability of a second subset of intermediate bits 580 corresponding to the second subset of information bits 520. In this case, the encoding device 410 may select a more reliable subset of either the first subset of codeword bits 550 or the second subset of codeword bits 560.

After selecting the subset of codeword bits, the encoding device 410 may repeat the above operations (e.g., described in connection with reference numbers 530-540) until a size of the subset of information bits reaches a predefined size. The encoding device 410 may then determine a subset of codeword bits that improves the least reliable subset of information bits of the predefined size, in a similar manner as described above. The encoding device 410 may then select a codeword bit, from that subset of codeword bits, using a predefined index sequence (e.g., with a same length as the predefined size, or $N_b$). The predefined index sequence may indicate an order in which codeword bits are to be selected, from the subset of codeword bits, for inclusion in the codeword.

In some aspects, if all of the codeword bits in the subset of codeword bits have been included in the codeword the same number of times (e.g., zero times, one time, etc.), then the encoding device 410 may select a codeword bit indicated by the first index in the predefined index sequence. However, if different codeword bits in the subset of codeword bits have been included in the codeword a different number of times, then the encoding device 410 may select a codeword bit included in the codeword a fewest number of times. If multiple codeword bits have been included in the codeword the same number of fewest times (e.g., zero times, one time, etc.), then the encoding device 410 may select the codeword bit with the highest priority according to the predefined index sequence.

As indicated above, this technique may improve and/or optimize a reliability of a codeword for a given set of active information bits (e.g., to be used for a HARQ-IR process), thereby increasing the likelihood that the decoding device successfully decodes the transmitted information while permitting use of a HARQ-IR process, which may conserve network resources, processing resources, and/or the like.

Although techniques and apparatuses described herein focus on an encoding process performed by an encoding device, an equivalent (e.g., reverse) decoding process may be performed by a decoding device to which the codeword is transmitted by the encoding device. For example, the decoding device may receive the codeword, may map the received codeword bits to information bits of the overall set of information bits, may fill in those information bits (e.g., the corresponding soft bits or log-likelihood ratio values) to the appropriate position in the overall set of information bits, and may run a decoding algorithm (e.g., successive cancellation, successive cancellation list, and/or the like) based on the overall set of information bits. In this way, the decoding device may decode the codeword received from the encoding device.

As indicated above, FIG. 5 is provided as an example. Other examples are possible and may differ from what was described with respect to FIG. 5.

Figure 6:
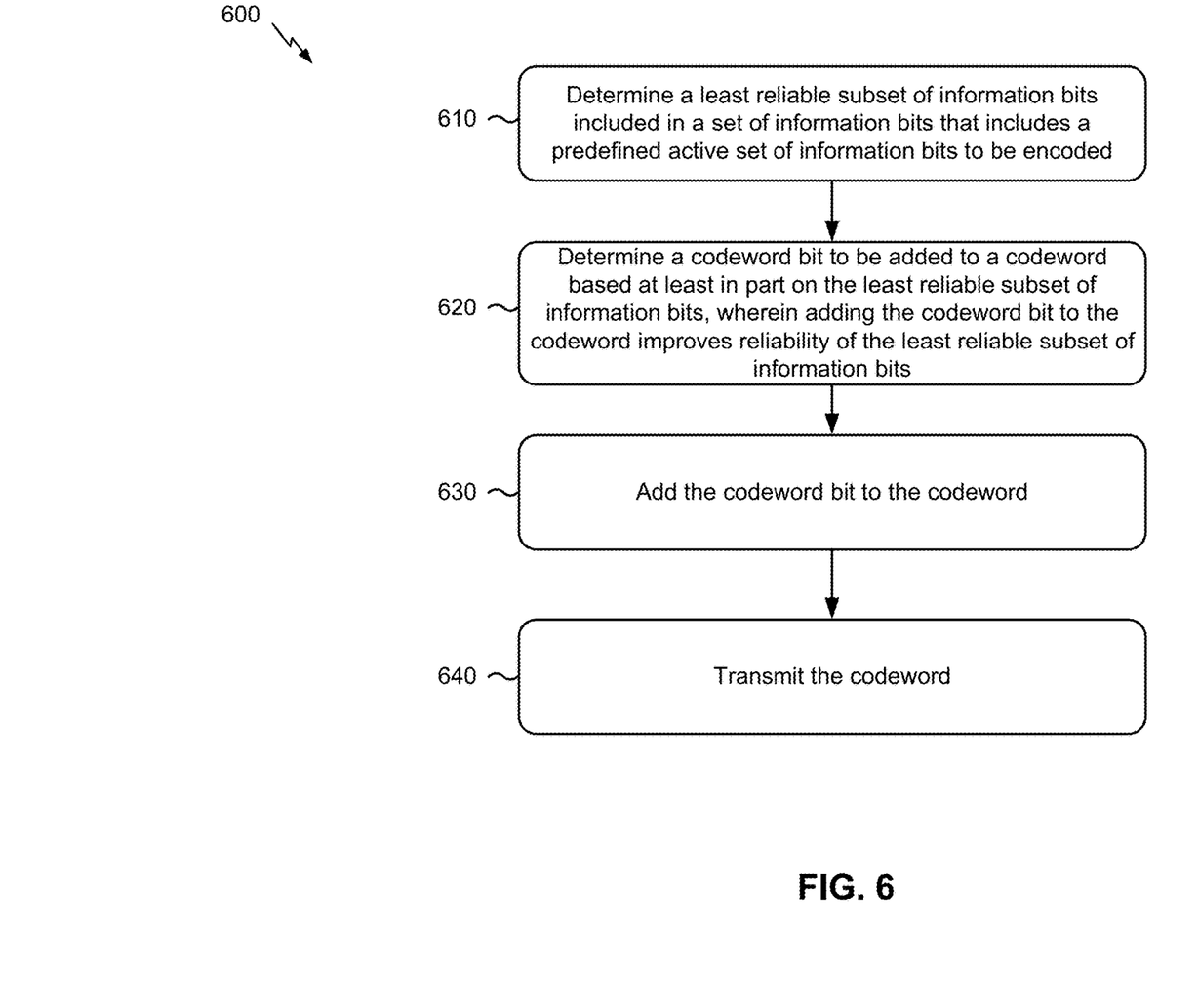
FIG. 6 is a diagram illustrating an example process performed, for example, by an encoding device, in accordance with various aspects of the present disclosure.

FIG. 6 is a diagram illustrating an example process 600 performed, for example, by an encoding device, in accordance with various aspects of the present disclosure. Example process 600 is an example where an encoding device (e.g., encoding device 310, encoding device 410, UE 120, base station 110, and/or the like) performs codeword bit selection for rate-compatible polar coding.

As shown in FIG. 6, in some aspects, process 600 may include determining a least reliable subset of information bits included in a set of information bits that includes a predefined active set of information bits to be encoded (block 610). For example, the encoding device (e.g., using controller/processor 240, controller/processor 280, and/or the like) may determine a least reliable subset of information bits included in a set of information bits that includes a predefined active set of information bits to be encoded, as described above in connection with FIGS. 4-5.

As further shown in FIG. 6, in some aspects, process 600 may include determining a codeword bit to be added to a codeword based at least in part on the least reliable subset of information bits, wherein adding the codeword bit to the codeword improves reliability of the least reliable subset of information bits (block 620). For example, the encoding device (e.g., using controller/processor 240, controller/processor 280, and/or the like) may determine a codeword bit to be added to a codeword based at least in part on the least reliable subset of information bits, as described above in connection with FIGS. 4-5. In some aspects, adding the codeword bit to the codeword improves reliability of the least reliable subset of information bits.

As further shown in FIG. 6, in some aspects, process 600 may include adding the codeword bit to the codeword (block 630). For example, the encoding device (e.g., using controller/processor 240, controller/processor 280, and/or the like) may add the codeword bit to the codeword, as described above in connection with FIGS. 4-5.

As further shown in FIG. 6, in some aspects, process 600 may include transmitting the codeword (block 640). For example, the encoding device (e.g., using controller/processor 240, transmit processor 220, TX MIMO processor 230, MOD 232, antenna 234, controller/processor 280, transmit processor 264, TX MIMO processor 266, MOD 254, antenna 252, and/or the like) may transmit the codeword, as described above in connection with FIGS. 4-5. The transmitted codeword may correspond to the codeword to which the codeword bit was added.

Process 600 may include additional aspects, such as any single aspect or any combination of aspects described below and/or in connection with one or more other processes described elsewhere herein.

In a first aspect, the least reliable subset of information bits is determined based at least in part on one or more codeword bits included in the codeword.

In a second aspect, alone or in combination with the first aspect, the codeword bit is determined based at least in part on one or more other codeword bits included in the codeword.

In a third aspect, alone or in combination with one or more of the first and second aspects, determining the codeword bit to be added to the codeword comprises: dividing the set of information bits into a first subset of information bits and a second subset of information bits; comparing a first reliability associated with the first subset of information bits and a second reliability associated with the second subset of information bits; and determining the codeword bit to be added to the codeword based at least in part on comparing the first reliability and the second reliability.

In a fourth aspect, alone or in combination with one or more of the first through third aspects, the codeword bit is selected from a first subset of codeword bits, corresponding to the first subset of information bits, or a second subset of codeword bits, corresponding to the second subset of information bits, based at least in part on comparing the first reliability and the second reliability.

In a fifth aspect, alone or in combination with one or more of the first through fourth aspects, the codeword bit is selected to improve a less reliable subset of either the first subset of codeword bits or the second subset of codeword bits based at least in part on a determination that the first subset of information bits is not more reliable than the second subset of information bits.

In a sixth aspect, alone or in combination with one or more of the first through fifth aspects, the codeword bit is selected to improve a more reliable subset of either the first subset of codeword bits or the second subset of codeword bits based at least in part on a determination that the first subset of information bits is more reliable than the second subset of information bits.

In a seventh aspect, alone or in combination with one or more of the first through sixth aspects, the least reliable subset of information bits is selected from multiple mutually exclusive subsets of the set of information bits, wherein the multiple mutually exclusive subsets together include all of the information bits in the set of information bits.

In an eighth aspect, alone or in combination with one or more of the first through seventh aspects, the least reliable subset of information bits has a predefined size.

In a ninth aspect, alone or in combination with one or more of the first through eighth aspects, the transmitted codeword includes only the codeword bit and no other codeword bits.

In a tenth aspect, alone or in combination with one or more of the first through eighth aspects, the transmitted codeword includes the codeword bit and one or more other codeword bits.

In an eleventh aspect, alone or in combination with one or more of the first through tenth aspects, each codeword bit, of the one or more other codeword bits, is determined based at least in part on a corresponding least reliable subset of information bits, having a predefined size, determined after adding a previously determined codeword bit to the codeword.

In a twelfth aspect, alone or in combination with one or more of the first through eleventh aspects, codeword bits are added to the codeword until a length of the codeword satisfies a threshold.

In a thirteenth aspect, alone or in combination with one or more of the first through twelfth aspects, the codeword is transmitted based at least in part on determining that the length of the codeword satisfies the threshold.

In a fourteenth aspect, alone or in combination with one or more of the first through thirteenth aspects, the least reliable subset of information bits includes a single least reliable information bit from the set of information bits.

In a fifteenth aspect, alone or in combination with one or more of the first through fourteenth aspects, the least reliable subset of information bits is determined based at least in part on performing multiple iterations that include determining a corresponding least reliable subset of information bits for each of the multiple iterations.

In a sixteenth aspect, alone or in combination with one or more of the first through fifteenth aspects, the codeword, to which the codeword bit is added, is empty.

In a seventeenth aspect, alone or in combination with one or more of the first through fifteenth aspects, the codeword, to which the codeword bit is added, includes one or more other codeword bits.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the aspects to the precise form disclosed. Modifications and variations are possible in light of the above disclosure or may be acquired from practice of the aspects.

As used herein, the term component is intended to be broadly construed as hardware, firmware, or a combination of hardware and software. As used herein, a processor is implemented in hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods, described herein, may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of possible aspects. In fact, many of these features may be combined in ways not specifically recited in the claims and/or disclosed in the specification. Although each dependent claim listed below may directly depend on only one claim, the disclosure of possible aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by an encoding device, comprising:
  determining a least reliable subset of information bits included in a set of information bits that includes a predefined active set of information bits to be encoded;
  determining a codeword bit to be added to a codeword based at least in part on the least reliable subset of information bits, wherein adding the codeword bit to the codeword improves reliability of the least reliable subset of information bits;
  adding the codeword bit to the codeword; and
  transmitting the codeword.

2. The method of claim 1, wherein the least reliable subset of information bits is determined based at least in part on one or more codeword bits included in the codeword.

3. The method of claim 1, wherein the codeword bit is determined based at least in part on one or more other codeword bits included in the codeword.

4. The method of claim 1, wherein determining the codeword bit to be added to the codeword comprises:
  dividing the set of information bits into a first subset of information bits and a second subset of information bits;
  comparing a first reliability associated with the first subset of information bits and a second reliability associated with the second subset of information bits; and
  determining the codeword bit to be added to the codeword based at least in part on comparing the first reliability and the second reliability.

5. The method of claim 4, wherein the codeword bit is selected from a first subset of codeword bits, corresponding to the first subset of information bits, or a second subset of codeword bits, corresponding to the second subset of information bits, based at least in part on comparing the first reliability and the second reliability.

6. The method of claim 5, wherein the codeword bit is selected to improve a less reliable subset of either the first subset of codeword bits or the second subset of codeword bits based at least in part on a determination that the first subset of information bits is not more reliable than the second subset of information bits.

7. The method of claim 5, wherein the codeword bit is selected to improve a more reliable subset of either the first subset of codeword bits or the second subset of codeword bits based at least in part on a determination that the first subset of information bits is more reliable than the second subset of information bits.

8. The method of claim 1, wherein the least reliable subset of information bits is selected from multiple mutually exclusive subsets of the set of information bits, wherein the multiple mutually exclusive subsets together include all of the information bits in the set of information bits.

9. The method of claim 1, wherein the least reliable subset of information bits has a predefined size.

10. The method of claim 1, wherein the transmitted codeword includes only the codeword bit and no other codeword bits.

11. The method of claim 1, wherein the transmitted codeword includes the codeword bit and one or more other codeword bits.

12. The method of claim 11, wherein each codeword bit, of the one or more other codeword bits, is determined based at least in part on a corresponding least reliable subset of information bits, having a predefined size, determined after adding a previously determined codeword bit to the codeword.

13. The method of claim 1, wherein codeword bits are added to the codeword until a length of the codeword satisfies a threshold.

14. The method of claim 13, wherein the codeword is transmitted based at least in part on determining that the length of the codeword satisfies the threshold.

15. The method of claim 1, wherein the least reliable subset of information bits includes a single least reliable information bit from the set of information bits.

16. The method of claim 1, wherein the least reliable subset of information bits is determined based at least in part on performing multiple iterations that include determining a corresponding least reliable subset of information bits for each of the multiple iterations.

17. The method of claim 1, wherein the codeword, to which the codeword bit is added, is empty.

18. The method of claim 1, wherein the codeword, to which the codeword bit is added, includes one or more other codeword bits.

19. An encoding device for wireless communication, comprising:
  memory; and
  one or more processors operatively coupled to the memory, the memory and the one or more processors configured to:
  determine a least reliable subset of information bits included in a set of information bits that includes a predefined active set of information bits to be encoded;
  determine a codeword bit to be added to a codeword based at least in part on the least reliable subset of information bits, wherein adding the codeword bit to the codeword improves reliability of the least reliable subset of information bits;
  add the codeword bit to the codeword; and
  transmit the codeword.

20. The encoding device of claim 19, wherein the least reliable subset of information bits is determined based at least in part on one or more codeword bits included in the codeword.

21. The encoding device of claim 19, wherein the codeword bit is determined based at least in part on one or more other codeword bits included in the codeword.

22. The encoding device of claim 19, wherein the codeword bit is determined based at least in part on:
  dividing the set of information bits into a first subset of information bits and a second subset of information bits;
  comparing a first reliability associated with the first subset of information bits and a second reliability associated with the second subset of information bits; and
  determining the codeword bit to be added to the codeword based at least in part on comparing the first reliability and the second reliability.

23. The encoding device of claim 22, wherein the codeword bit is selected from a first subset of codeword bits, corresponding to the first subset of information bits, or a second subset of codeword bits, corresponding to the second subset of information bits, based at least in part on comparing the first reliability and the second reliability.

24. The encoding device of claim 23, wherein the codeword bit is selected to improve a less reliable subset of either the first subset of codeword bits or the second subset of codeword bits based at least in part on a determination that the first subset of information bits is not more reliable than the second subset of information bits.

25. The encoding device of claim 23, wherein the codeword bit is selected to improve a more reliable subset of either the first subset of codeword bits or the second subset of codeword bits based at least in part on a determination that the first subset of information bits is more reliable than the second subset of information bits.

26. The encoding device of claim 19, wherein the least reliable subset of information bits has a predefined size.

27. The encoding device of claim 19, wherein codeword bits are added to the codeword until a length of the codeword satisfies a threshold; and wherein the codeword is transmitted based at least in part on determining that the length of the codeword satisfies the threshold.

28. The encoding device of claim 19, wherein the least reliable subset of information bits is determined based at least in part on performing multiple iterations that include determining a corresponding least reliable subset of information bits for each of the multiple iterations.

29. A non-transitory computer-readable medium storing one or more instructions for wireless communication, the one or more instructions comprising:
  one or more instructions that, when executed by one or more processors of an encoding device, cause the one or more processors to:
    determine a least reliable subset of information bits included in a set of information bits that includes a predefined active set of information bits to be encoded;
    determine a codeword bit to be added to a codeword based at least in part on the least reliable subset of information bits, wherein adding the codeword bit to the codeword improves reliability of the least reliable subset of information bits;
    add the codeword bit to the codeword; and
    transmit the codeword.

30. An apparatus for wireless communication, comprising:
  means for determining a least reliable subset of information bits included in a set of information bits that includes a predefined active set of information bits to be encoded;
  means for determining a codeword bit to be added to a codeword based at least in part on the least reliable subset of information bits, wherein adding the codeword bit to the codeword improves reliability of the least reliable subset of information bits;
  means for adding the codeword bit to the codeword; and
  means for transmitting the codeword.

\* \* \* \* \*